(12) United States Patent
Clifford

(10) Patent No.: US 8,555,214 B2
(45) Date of Patent: Oct. 8, 2013

(54) TECHNIQUE FOR ANALYZING A REFLECTIVE PHOTO-MASK

(75) Inventor: Christopher Heinz Clifford, San Francisco, CA (US)

(73) Assignee: Luminescent Technologies, Inc., Palo Alto, CA (US)

( * ) Notice: Subject to any disclaimer, the term of this patent is extended or adjusted under 35 U.S.C. 154(b) by 232 days.

(21) Appl. No.: 13/021,591

(22) Filed: Feb. 4, 2011

(65) Prior Publication Data
US 2012/0066652 A1  Mar. 15, 2012

Related U.S. Application Data

(60) Provisional application No. 61/382,857, filed on Sep. 14, 2010.

(51) Int. Cl.
*G06F 17/50* (2006.01)
(52) U.S. Cl.
USPC .............. 716/55; 716/126; 716/132; 716/139
(58) Field of Classification Search
USPC ................................... 716/55, 126, 132, 139
See application file for complete search history.

(56) References Cited

U.S. PATENT DOCUMENTS

| | | | |
|---|---|---|---|
| 5,640,199 A | 6/1997 | Garakani et al. | |
| 6,042,998 A | 3/2000 | Brueck et al. | |
| 6,235,434 B1 | 5/2001 | Sweeney et al. | |
| 6,480,285 B1 | 11/2002 | Hill | |
| 6,484,306 B1 | 11/2002 | Bokor et al. | |
| 6,563,566 B2 | 5/2003 | Rosenbluth et al. | |
| 6,709,792 B2 | 3/2004 | Nako | |
| 6,871,337 B2 | 3/2005 | Socha | |

(Continued)

FOREIGN PATENT DOCUMENTS

| DE | 102007 028172 B3 | 11/2008 |
|---|---|---|
| JP | 2009 010373 | 1/2009 |

(Continued)

OTHER PUBLICATIONS

Khan, M. et al., "A Semi-Empirical Resist Dissolution Model for Sub-micron Lithographies", pp. 41-46, by Technical Proceedings of the 1998 International Conference on Modeling and Simulation of Microsystems, 1998.

(Continued)

*Primary Examiner* — Thuan Do
(74) *Attorney, Agent, or Firm* — Wilson Sonsini Goodrich & Rosati

(57) ABSTRACT

During a calculation technique, contributions to reflected light from multiple discrete cells in a model of a multilayer stack in a reflective photo-mask may be determined based on angles of incidence of light in a light pattern to the multilayer stack, a polarization of the light in the light pattern, and a varying intensity of the light in the light pattern through the multilayer stack. Then, phase values of the contributions to the reflected light from the multiple discrete cells are adjusted, thereby specifying optical path differences between the multiple discrete cells in the multilayer stack that are associated with the defect. Moreover, the contributions to the reflected light from multiple discrete cells are combined to determine the reflected light from the multilayer stack. Next, k-space representations of the contributions to the reflected light from the multiple discrete cells are selectively shifted based on the angles of incidence.

22 Claims, 5 Drawing Sheets

(56) References Cited

U.S. PATENT DOCUMENTS

| | | |
|---|---|---|
| 6,873,720 B2 | 3/2005 | Cai et al. |
| 6,925,202 B2 | 8/2005 | Karklin et al. |
| 7,003,755 B2 | 2/2006 | Pang et al. |
| 7,043,071 B2 | 5/2006 | Qian et al. |
| 7,057,709 B2 | 6/2006 | Rosenbluth |
| 7,073,162 B2 | 7/2006 | Cobb et al. |
| 7,093,226 B2 | 8/2006 | Pang |
| 7,093,229 B2 | 8/2006 | Pang et al. |
| 7,107,573 B2 | 9/2006 | Yamazoe et al. |
| 7,124,394 B1 | 10/2006 | Abrams et al. |
| 7,152,219 B2 | 12/2006 | Pang |
| 7,178,127 B2 | 2/2007 | Abrams et al. |
| 7,231,628 B2 | 6/2007 | Pack et al. |
| 7,254,251 B2 | 8/2007 | Cai et al. |
| 7,302,090 B2 | 11/2007 | Kalus et al. |
| 7,363,611 B2 | 4/2008 | Rosenbluth |
| 7,376,512 B2 * | 5/2008 | Hirscher et al. ............... 702/1 |
| 7,384,710 B2 | 6/2008 | Ogawa et al. |
| 7,403,649 B2 | 7/2008 | Cai et al. |
| 7,441,227 B2 | 10/2008 | Abrams et al. |
| 7,480,889 B2 | 1/2009 | Abrams et al. |
| 7,483,559 B2 | 1/2009 | Luk-Pat et al. |
| 7,557,921 B1 | 7/2009 | Adel et al. |
| 7,565,001 B2 | 7/2009 | Cai et al. |
| 7,571,423 B2 | 8/2009 | Abrams et al. |
| 7,617,474 B2 | 11/2009 | Pang et al. |
| 7,646,906 B2 | 1/2010 | Saidin et al. |
| 7,676,077 B2 | 3/2010 | Kulkarni et al. |
| 7,689,966 B2 | 3/2010 | Verma et al. |
| 7,695,876 B2 | 4/2010 | Ye et al. |
| 7,698,665 B2 | 4/2010 | Abrams et al. |
| 7,703,049 B2 | 4/2010 | Abrams et al. |
| 7,703,068 B2 | 4/2010 | Abrams et al. |
| 7,707,541 B2 | 4/2010 | Abrams et al. |
| 7,749,666 B2 | 7/2010 | Gassner et al. |
| 7,757,201 B2 | 7/2010 | Abrams et al. |
| 7,769,225 B2 | 8/2010 | Kekare et al. |
| 7,805,700 B2 | 9/2010 | Peng |
| 7,853,920 B2 | 12/2010 | Preil et al. |
| 7,921,383 B1 | 4/2011 | Wei |
| 7,984,391 B2 | 7/2011 | Abrams et al. |
| 7,992,109 B2 | 8/2011 | Abrams et al. |
| 7,995,832 B2 | 8/2011 | Xiong et al. |
| 8,056,021 B2 | 11/2011 | Abrams et al. |
| 8,057,967 B2 | 11/2011 | Ye et al. |
| 8,142,958 B2 | 3/2012 | Holfeld |
| 8,200,002 B2 | 6/2012 | Preil et al. |
| 8,204,295 B2 | 6/2012 | Preil et al. |
| 8,208,712 B2 | 6/2012 | Preil et al. |
| 8,260,032 B2 | 9/2012 | Preil et al. |
| 8,280,146 B2 | 10/2012 | Preil et al. |
| 8,285,030 B2 | 10/2012 | Zhou et al. |
| 8,331,645 B2 | 12/2012 | Preil et al. |
| 2002/0192578 A1 | 12/2002 | Tanaka et al. |
| 2003/0103189 A1 | 6/2003 | Neureuther et al. |
| 2003/0106642 A1 | 6/2003 | Fairbairn et al. |
| 2004/0008880 A1 | 1/2004 | Horie et al. |
| 2004/0265707 A1 | 12/2004 | Socha |
| 2005/0122500 A1 | 6/2005 | Ye et al. |
| 2006/0048089 A1 | 3/2006 | Schwarzband |
| 2006/0051682 A1 | 3/2006 | Hess et al. |
| 2006/0062445 A1 | 3/2006 | Verma et al. |
| 2006/0273242 A1 | 12/2006 | Hunsche et al. |
| 2007/0105029 A1 * | 5/2007 | Ausschnitt ............... 430/30 |
| 2007/0133862 A1 | 6/2007 | Gold et al. |
| 2007/0198963 A1 | 8/2007 | Granik |
| 2008/0152212 A1 | 6/2008 | Feldman |
| 2008/0170774 A1 | 7/2008 | Xiong et al. |
| 2008/0198350 A1 | 8/2008 | Sugita et al. |
| 2008/0241708 A1 | 10/2008 | Lin et al. |
| 2010/0021042 A1 | 1/2010 | Preil et al. |
| 2010/0021043 A1 | 1/2010 | Preil et al. |
| 2010/0021824 A1 | 1/2010 | Preil et al. |
| 2010/0080443 A1 | 4/2010 | Preil et al. |
| 2010/0086195 A1 | 4/2010 | Preil et al. |
| 2010/0119143 A1 | 5/2010 | Preil et al. |
| 2010/0135568 A1 | 6/2010 | Preil et al. |
| 2011/0022994 A1 | 1/2011 | Hu et al. |
| 2011/0194752 A1 | 8/2011 | Pang |
| 2011/0229805 A1 | 9/2011 | Wang et al. |
| 2012/0066651 A1 | 3/2012 | Pang et al. |
| 2012/0066652 A1 | 3/2012 | Clifford |
| 2012/0134542 A1 | 5/2012 | Pang et al. |
| 2012/0137260 A1 | 5/2012 | Pang et al. |
| 2012/0189187 A9 | 7/2012 | Preil et al. |

FOREIGN PATENT DOCUMENTS

| | | |
|---|---|---|
| WO | WO 2005/078528 A2 | 8/2005 |
| WO | WO 2005/078528 A3 | 8/2005 |
| WO | WO 2008/039674 A2 | 4/2008 |
| WO | WO 2008/039674 A3 | 4/2008 |

OTHER PUBLICATIONS

Pang, L. et al., "Computational Lithogaphy & Inspection (CLI) and its Applications in Mask Inspection, Metrology, Review, and Repair," Luminescent Technologies Inc., Palo Alto, CA, Sep. 28, 2010.

J.A. Sethian and D. Adalsteinsson, "An overview of level set methods for etching, deposition, and lithography development", IEEE Trans. on Semiconductor Manufacturing, vol. 10, No. 1, pp. 1-30, Jan. 8, 1996.

Preliminary Amendment filed Jul. 11, 2012, Pang, et al., U.S. Appl. No. 13/024,233, "Technique for Repairing a Reflective Photo-Mask" filed Feb. 9, 2011.

Office Action issued by U.S. Patent and Trademark Office, mailed Oct. 2, 2012, in Pang, et al., U.S. Appl. No. 13/024,233, "Technique for Repairing a Reflective Photo-Mask" filed Feb. 9, 2011.

Response to Office Action filed Feb. 4, 2013, in Pang, et al., U.S. Appl. No. 13/024,233, "Technique for Repairing a Reflective Photo-Mask" filed Feb. 9, 2011.

Office Action issued by U.S. Patent and Trademark Office, mailed Jun. 14, 2012, in Pang, U.S. Appl. No. 12/955,617, "Virtual Photo-Mask Critical-Dimension Measurement" filed Nov. 29, 2010.

Response to Office Action filed Oct. 15, 2012, in Pang, U.S. Appl. No. 12/955,617, "Virtual Photo-Mask Critical-Dimension Measurement" filed Nov. 29, 2010.

Notice of Allowance issued by U.S. Patent and Trademark Office, mailed Oct. 31, 2012, in Pang, U.S. Appl. No. 12/955,617, "Virtual Photo-Mask Critical-Dimension Measurement" filed Nov. 29, 2010.

Chen, C.Y. et al, "Mask defect auto disposition based on aerial image in mask product", Proc. SPIE 7379, 73791F (2009).

Pang, L., et al. "Full Chip Scale Source Mask Optimization (SMO) Implemented through Level Set Methods based Inverse Lithography Technology (ILT) Framework," Luminescent Litho Workshop 2009 Abstract, Apr. 29, 2009 vJM1.

Pang et al., "Considering Meef in Inverse Lithography Technology (ILT) and Source Mask Optimization (SMO)" SPIE, vol. 7122, 14 pgs., (Oct. 17, 2008).

Rosenbluth et al., "Optimum Mask and Source Patterns to Print Given Shape", Apr. 2002, SPIE Proceedings vol. 4346, pp. 13-30.

Xiao et al., "Source Optimization and Mask Design to Minimize MEEF in Low $k_1$ Lithography" SPIE, vol. 7028, 11 pgs., (Jun. 9, 2008).

Satake, et al., "Technique for Repairing a Reflective Photo-Mask," U.S. Appl. No. 13/764,517, filed Feb. 11, 2013.

Office Action issued by U.S. Patent and Trademark Office, mailed Apr. 5, 2013, in Pang, L. et al., U.S. Appl. No. 13/024,233, "Technique for Repairing a Reflective Photo-Mask," filed Feb. 9, 2011.

Pang, L., "Technique for Repairing a Reflective Photo-Mask," U.S. Appl. No. 13/024,233, filed Feb. 9, 2011.

Office Action issued by U.S. Patent and Trademark Office, mailed Oct. 2, 2012, in Pang, L. et al., U.S. Appl. No. 13/024,233, "Technique for Repairing a Reflective Photo-Mask," filed Feb. 9, 2011.

Office Action issued by U.S. Patent and Trademark Office, mailed Oct. 24, 2011, in Preil, Moshe E. et al., U.S. Appl. No. 12/475,349, "Photo-Mask and Wafer Image Reconstruction" filed May 29, 2009.

Response to Office Action filed Feb. 14, 2012, in Preil, Moshe E. et al., U.S. Appl. No. 12/475,349, "Photo-Mask and Wafer Image Reconstruction" filed May 29, 2009.

Petition Under C.F.R. § 1.78(A)(6) to Accept an Unintentionally Delayed Claim Under 35 U.S.C § 119(E) for the Benefit of a Prior Provisional Application filed Feb. 14, 2012 in Preil, Moshe E. et al., U.S. Appl. No. 12/475,349, "Photo-Mask and Wafer Image Reconstruction" filed May 29, 2009.

Notice of Allowance issued by U.S. Patent and Trademark Office, mailed Sep. 27, 2012, in Preil, Moshe E. et al., U.S. Appl. No. 12/475,349, "Photo-Mask and Wafer linage Reconstruction" filed May 29, 2009.

Preliminary Amendment filed Feb. 13, 2012, Preil, Moshe E. et al., U.S. Appl. No. 12/440,722, "Photo-Mask and Wafer Image Reconstruction" filed Feb. 5, 2010.

Written Opinion issued by U.S. Patent and Trademark Office, mailed Mar. 25, 2008, in Luminescent Technologies, Inc. International Application No. PCT/US07/078913, "Photo-Mask and Wafer Image Reconstruction" filed Sep. 19, 2007.

Response to Written Opinion filed Jul. 17, 2008, in Luminescent Technologies, Inc. International Application No. PCT/US07/078913, "Photo-Mask and Wafer Image Reconstruction" filed Sep. 19, 2007.

Office Action issued by U.S. Patent and Trademark Office, mailed Jun. 26, 2013, in Preil, Moshe E. et al., U.S. Appl. No. 12/440,722, "Photo-Mask and Wafer Image Reconstruction" filed Feb. 5, 2010.

Notice of Allowance issued by U.S. Patent and Trademark Office, mailed Aug. 2, 2013, in Pang, L. et al., U.S. Appl. No. 13/024,233, "Technique for Repairing a Reflective Photo-Mask," filed Feb. 9, 2011.

* cited by examiner

TECHNIQUE FOR ANALYZING A REFLECTIVE PHOTO-MASK

CROSS REFERENCE TO RELATED APPLICATIONS

This application claims priority under 35 U.S.C. §119(e) to U.S. Provisional Application Ser. No. 61/382,857, entitled "Technique for Analyzing a Reflective Photo-Mask," by Christopher Heinz Clifford, filed on Sep. 14, 2010, the contents of which are herein incorporated by reference.

BACKGROUND OF THE INVENTION

1. Field of the Invention

The present invention relates to techniques for inspecting and qualifying a photo-mask. More specifically, the invention relates to a technique for calculating the effect of a defect in a reflective photo-mask in a photolithographic process.

2. Related Art

Photolithography is a widely used technology for producing integrated circuits. In this technique, a light source illuminates a photo-mask. The resulting spatially varying light pattern is projected onto a photoresist layer on a semiconductor wafer by an optical system (which is referred to as an 'exposure tool'). By developing the 3-dimensional pattern produced in this photoresist layer (which is sometimes referred to as a 'target pattern'), a layer in the integrated circuit is created. Furthermore, because there are often multiple layers in a typical integrated circuit, these operations may be repeated using several photo-masks to produce a product wafer.

In order to appropriately scale to smaller critical dimensions in integrated circuits (and, thus, to reduce diffraction and proximity effects that occur when light is propagated through the optics of the exposure tool and is converted into the 3-dimensional pattern in the photoresist), commensurately smaller wavelengths of light may be provided by the light source. However, it is difficult to design and manufacture transmission photo-masks at small wavelengths, such as in the extreme ultra-violet.

Recently, reflective photo-masks have been investigated for use with wavelengths in the extreme ultra-violet. In a reflective photo-mask, a multilayer stack is used to reflect the light from the light source. For example, multiple alternating layers of silicon and molybdenum may be deposited on silicon or a glass substrate having an ultra-low thermal expansion coefficient (such as quartz). Then, the mask pattern may be defined in an absorption layer (such as tantalum nitride) that is deposited on top of the multilayer stack.

In practical reflecting photo-masks, up to 80 alternating layers are used. Furthermore, these layers may have thicknesses as small as 2-4 nm. However, this structure can be difficult to manufacture. For example, during the manufacturing process defects can occur throughout the multilayer stack. It can be difficult to detect the presence of a defect in the multilayer stack without performing destructive analysis. In addition, even if a defect is detected (or when a type of defect is probable in a given manufacturing process), it is often difficult (or impossible) to predict the consequences of the defect in the photolithographic process (e.g., will the defect result in an unacceptable change in the 3-dimensional pattern). As a consequence, the inspection and qualification criteria for reflective photo-masks are often needlessly conservative, which results in rejection of reflective photo-masks that could be successfully used in the photolithographic process (i.e., the reflective photo-mask yield may be needlessly reduced), thereby significantly increasing the cost of reflective photo-masks.

Hence, what is needed is a reflective photo-mask inspection and qualification technique that overcomes the problems listed above.

SUMMARY OF THE INVENTION

The present disclosure relates to a computer system for calculating reflected light from a multilayer stack in a reflective photo-mask. During operation, the computer system determines contributions to reflected light from multiple discrete cells in a model of the multilayer stack in the reflective photo-mask based on angles of incidence of light in a light pattern to the multilayer stack, a polarization of the light in the light pattern, and a varying intensity of the light in the light pattern through the multilayer stack, where the multiple discrete cells are at horizontal and vertical positions in the multilayer stack, and where the multilayer stack includes at least one defect. Then, the computer system adjusts phase values of the contributions to the reflected light from the multiple discrete cells, thereby specifying optical path differences between the multiple discrete cells in the multilayer stack that are associated with the defect. Moreover, the computer system combines the contributions to the reflected light from multiple discrete cells to determine the reflected light from the multilayer stack. Next, the computer system selectively shifts k-space representations of the contributions to the reflected light from the multiple discrete cells based on the angles of incidence, thereby accounting for phase variations associated with deviations from normal incidence.

Note that the horizontal and vertical positions may be included in horizontal planes (e.g., x,y planes) in the multilayer stack that are separated by a spacing or a height z. In these embodiments, deviations in vertical positions within the multilayer stack that are associated with the defect may be addressed using the phase values. Furthermore, determining the reflected light from a given discrete cell in the multiple discrete cells may use a closed-form expression for the reflected light. For example, the closed-form expression may treat the given discrete cell as an infinite two-dimensional sheet in the multilayer stack.

In some embodiments, the defect is associated with vertical displacements and/or a change in a thickness of one or more layers in a region in the multilayer stack.

Additionally, for a given discrete cell, the varying intensity of the light pattern through the multilayer stack may involve calculating cumulative reflection and absorption by intervening discrete cells between the given discrete cell and a top surface of the multilayer stack.

In some embodiments, prior to determining the contributions to the reflected light from the multiple discrete cells, the computer system calculates absorption of incident light to the reflective photo-mask by an absorption layer in the model, which is deposited on the multilayer stack in the reflective photo-mask, thereby determining the light pattern incident to the multilayer stack, where the absorption layer includes a mask pattern of the reflective photo-mask. Note that the incident light may be represented by a plane wave and/or the light pattern may include a near-field diffraction pattern associated with the mask pattern. Furthermore, after combining the contributions to the reflected light from multiple discrete cells, the computer system may calculate absorption of the reflected light from the reflective photo-mask by the absorption layer, thereby calculating reflected light from the reflective photo-mask. Additionally, the computer system may calculate an aerial image at an image plane of an optical path in the photolithographic process using a forward optical calculation based on the reflected light from the reflective photo-mask, information about the optical path in the photolithographic process and conditions associated with the photolithographic process.

In some embodiments, the computer system calculates an estimated resist pattern based on the aerial image and a model of a photoresist in the photolithographic process. Furthermore, the computer system may identify differences between the estimated resist pattern and a target pattern, and the computer system may determine an acceptance condition of the reflective photo-mask based on the identified differences.

In some embodiments, the computer system calculates a modification to the multilayer stack based on the defect. For example, the computer system may change a thickness of the absorption layer and/or may modify a two-dimensional pattern of the absorption layer.

Another embodiment provides a method including at least some of the above-described operations.

Another embodiment provides a computer-program product for use in conjunction with the computer system.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

Note that like reference numerals refer to corresponding parts throughout the drawings. Moreover, multiple instances of the same part are designated by a common prefix separated from an instance number by a dash.

DETAILED DESCRIPTION OF THE INVENTION

Figure 1:
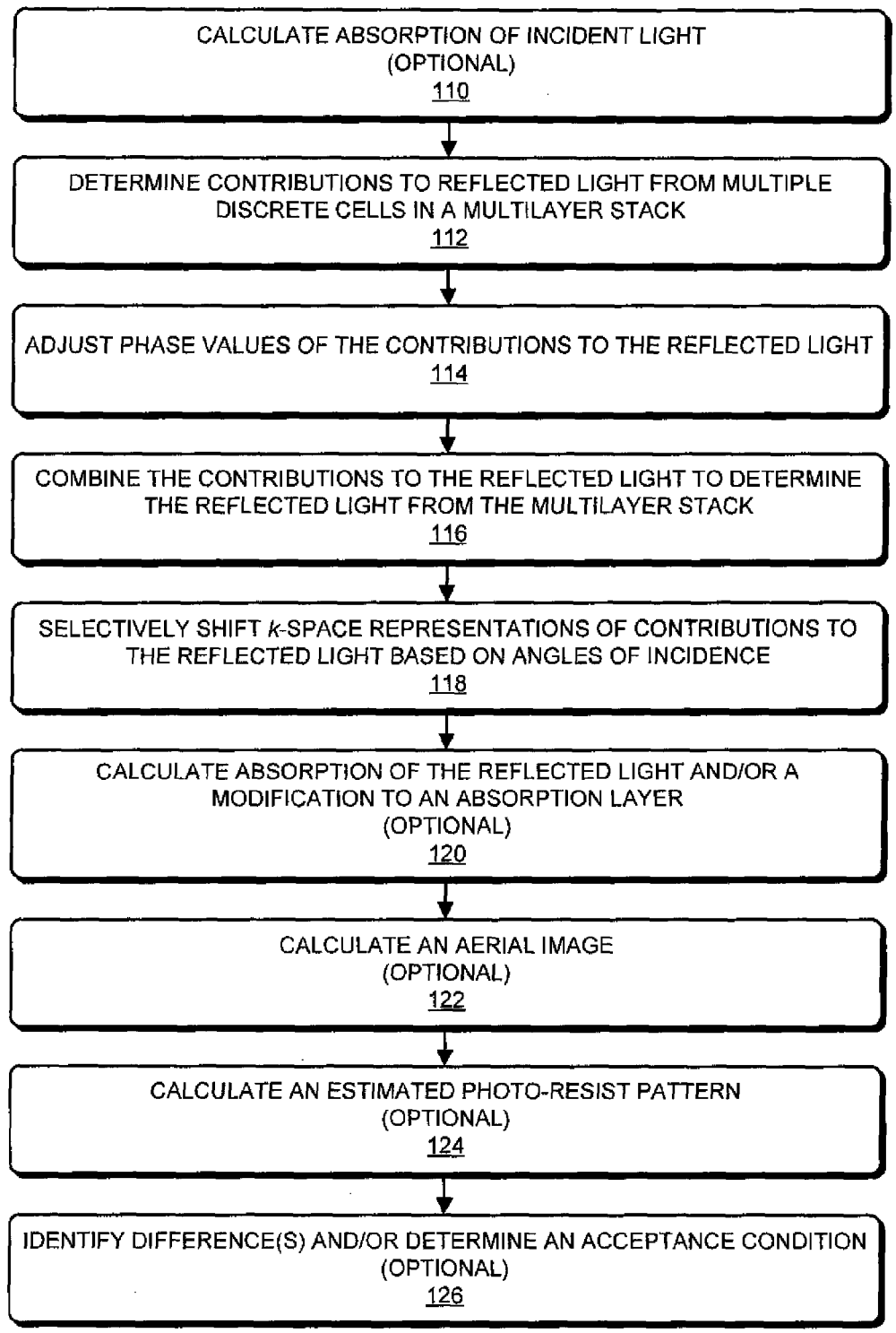
FIG. 1 is a flow chart illustrating a method for calculating reflected light from a multilayer stack in a reflective photo-mask in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer program product (i.e., software) for use with the computer system are described. These devices and processes may be used to calculate reflected light from a multilayer stack in a reflective photo-mask, which, in turn, can be used to determine whether or not the reflective photo-mask (which may include defects) is acceptable for use in a photolithographic process. In particular, contributions to the reflected light from multiple discrete cells in a model of the multilayer stack in the reflective photo-mask may be determined based on angles of incidence of light in a light pattern to the multilayer stack, a polarization of the light in the light pattern, and a varying intensity of the light in the light pattern through the multilayer stack. Then, phase values of the contributions to the reflected light from the multiple discrete cells are adjusted, thereby specifying optical path differences between the multiple discrete cells in the multilayer stack that are associated with the defect. Moreover, the contributions to the reflected light from multiple discrete cells are combined to determine the reflected light from the multilayer stack. Next, k-space representations of the contributions to the reflected light from the multiple discrete cells are selectively shifted based on the angles of incidence, thereby accounting for phase variations associated with deviations from normal incidence.

This calculation technique may provide a fast and accurate approach for calculating the reflected light from the multilayer stack. As a consequence, it may be useful in assessing the impact of one or more defects in the multilayer stack in the photolithographic process. For example, the calculated reflected light from the multilayer stack may be used to determine an aerial image at an image plane of an optical path associated with the photolithographic process (such as the aerial image at a wafer in a exposure tool) and/or an estimated resist pattern. Furthermore, for a given defect, the impact in the aerial image and/or the estimated resist pattern may be determined with different mask patterns to assess which mask patterns can be used with a multilayer stack that includes the given defect. Therefore, the calculation technique may be used to determine an acceptance condition of the reflective photo-mask, which may allow improved inspection and qualification criteria for reflective photo-masks, with a commensurate impact on reflective-photo-mask yield and cost.

In the discussion that follows, a reflective photo-mask should be understood to include an absorption layer, an alternating phase-shift layer, and/or an attenuating phase-shift layer deposited on a multilayer stack, which in turn is deposited on a substrate. This reflective photo-mask may be used in extreme ultra-violet photolithography. Furthermore, the reflective photo-mask may be used in multiple-exposure photolithography, where patterns printed on a wafer or semiconductor die using two or more reflective photo-masks are combined to produce a desired or target pattern, such as a portion of an integrated circuit. Furthermore, a mask pattern should be understood to include the pattern of spatially varying transmittance magnitude and/or transmittance phase of the absorption layer, the alternating phase-shift layer, and/or the attenuating phase-shift layer deposited on the multilayer stack. Note that, typically, the manufactured or fabricated mask pattern in a given reflective photo-mask may deviate from an ideal target mask pattern, for example, because of defects that can occur during the photo-mask fabrication process. In addition, as described further below, there may be defects in the multilayer stack.

In addition, in the discussion that follows note that a mask pattern or a target pattern may include a bitmap or grayscale file that includes a set of values corresponding to pixels in the mask pattern or the target pattern. Furthermore, the quantization (i.e., the number of bits) in these files may be varied, as needed, during the calculations that are described. Alternative formats having the same or similar information content, including a vector-based format such as a Graphic Design System II (GDSII) and/or an OASIS format, may be used in some embodiments of the mask pattern or the target pattern. In some embodiments, the mask pattern or the target pattern include real and imaginary components (or equivalently, magnitude and phase information).

We now describe embodiments of the calculation technique. FIG. 1 presents a flow chart illustrating a method 100 for calculating reflected light from a multilayer stack in a reflective photo-mask (such as a reflective photo-mask for use in an extreme ultra-violet range of wavelengths), which is performed by a computer system (such as computer system 400 in FIG. 4). During operation, the computer system determines contributions to reflected light from multiple discrete cells in a model of the multilayer stack in the reflective photo-mask based on angles of incidence of light in a light pattern to the multilayer stack, a polarization of the light in the light pattern, and a varying intensity of the light in the light pattern through the multilayer stack (operation 112), where the multiple discrete cells are at horizontal and vertical positions in the multilayer stack, and where the multilayer stack includes at least one defect. Then, the computer system adjusts phase values of the contributions to the reflected light from the multiple discrete cells (operation 114), thereby specifying optical path differences between the multiple discrete cells in the multilayer stack that are associated with the defect. Moreover, the computer system combines the contributions to the reflected light from multiple discrete cells to determine the reflected light from the multilayer stack (operation 116). Next, the computer system selectively shifts k-space representations of the contributions to the reflected light from the multiple discrete cells based on the angles of incidence (operation 118), thereby accounting for phase variations associated with deviations from normal incidence. Note that this approach to handling the variations in the normal orientation may result in a reasonable tradeoff between the speed and the accuracy of the calculation technique (for example, the calculation technique may be four to five-times faster than existing reflected-light calculation techniques, and the accuracy may be 4% for incident light having an angle of incidence up to 9°).

Note that the horizontal and vertical positions may be included in horizontal planes (e.g., x,y planes) in the multilayer stack that are separated by a spacing or a height z. In these embodiments, deviations in vertical positions within the multilayer stack that are associated with the defect may be addressed using the phase values. Furthermore, determining the reflected light from a given discrete cell in the multiple discrete cells may use a closed-form expression for the reflected light. For example, the closed-form expression may treat the given discrete cell as an infinite two-dimensional sheet in the multilayer stack.

In some embodiments, the defect is associated with vertical displacements and/or a change in a thickness of one or more layers in a region in the multilayer stack. More generally, the defect may include a deviation in a magnitude and/or a phase of the reflectance of the reflective photo-mask from that associated with reflective photo-mask that excludes the defect, and which has a target mask pattern defined on its top surface. Thus, the defect may include a hard defect (such as a sputtering-induced bump in at least some of the layers in the multilayer stack), an error in the mask pattern, and/or a soft defect (such as dirt or contamination on the surface of the reflective photo-mask).

Additionally, for a given discrete cell, the varying intensity of the light pattern through the multilayer stack may involve calculating cumulative reflection and absorption by intervening discrete cells between the given discrete cell and a top surface of the multilayer stack.

In some embodiments, prior to determining the contributions to the reflected light from the multiple discrete cells, the computer system optionally calculates absorption of incident light to the reflective photo-mask by an absorption layer in the model (operation 110), which is deposited on the multilayer stack in the reflective photo-mask, thereby determining the light pattern incident to the multilayer stack, where the absorption layer includes a mask pattern of the reflective photo-mask. Note that the incident light may be represented by a plane wave and/or the light pattern may include a near-field diffraction pattern associated with the mask pattern. Furthermore, after combining the contributions to the reflected light from multiple discrete cells, the computer system may optionally calculate absorption of the reflected light from the reflective photo-mask by the absorption layer (operation 120), thereby calculating reflected light from the reflective photo-mask. In some embodiments, the computer system calculates a modification to the multilayer stack based on the defect (operation 120). For example, the computer system may change a thickness of the absorption layer and/or may modify a two-dimensional pattern of the absorption layer (which collectively are sometimes referred to as 'multilayer defect compensation').

Additionally, the computer system may optionally calculate an aerial image at an image plane of an optical path in a photolithographic process using a forward optical calculation based on the reflected light from the reflective photo-mask, information about the optical path in the photolithographic process and conditions associated with the photolithographic process (operation 122). For example, the forward optical calculation may be based on the information about the optical path associated with an imaging system (such as an exposure tool) that is used in the photolithographic process. Note that the conditions associated with the photolithographic process may include: immersion optics, a source pattern (for example, an annular, quadrupole, disk illumination with a sigma of 0.75, and/or a pixilated source pattern), a numerical aperture of 0.32 or 0.67, a wavelength of 260 nm, etc.

In some embodiments, the computer system optionally calculates an estimated resist pattern based on the aerial image and a model of a photoresist (such as a model of a positive or a negative resist) in the photolithographic process (operation 124). Note that one or more aerial images and/or estimated photoresist patterns may be determined using a variety or a range of imaging conditions, such as: different wavelengths, different focal conditions, different illumination types (such as annular, quadrupole, immersion, etc.), etc. Furthermore, the computer system may optionally identify differences between the estimated resist pattern and a target pattern (or differences between the aerial image and the target pattern), and/or the computer system may optionally determine an acceptance condition of the reflective photo-mask based on the identified differences (operation 126).

For example, a photo-mask qualifier may analyze the aerial image and/or the estimated resist pattern to determine if it is acceptable, e.g., if differences with respect to the target pattern and/or any deviations that are present are within acceptable bounds, such as a fraction of a critical dimension in the target pattern. (In embodiments where the aerial image is used instead of the estimated photoresist pattern, this may involve prior correlation with the critical dimension(s) of a test wafer.) If yes, the reflective photo-mask may be accepted and, if not, the reflective photo-mask may be: rejected, subject to rework, or subject to additional qualification testing.

In some embodiments, the reflective photo-mask is accepted (or not) based on a process window (such as a range of exposure times, a depth of focus, a range of exposure intensities, and/or a normalized image log slope) associated with the photolithographic process. In this way, a particular defect that is fatal when slightly overexposed may be identified, even though it is negligible at the nominal dose. In addition, in some embodiments the reflective photo-mask is accepted (or not) based on features in the aerial image and/or the estimated resist pattern that are identified over or throughout the process window and/or based on an impact on a critical dimension across the process window. Note that acceptance of the reflective photo-mask may be fully automated, while in other embodiments it may not be fully automated. Thus, information (such as identified differences or features) may be presented to an operator, who may verify an acceptance recommendation made by the computer system (such as a reflective photo-mask inspection and qualification system) or who may independently determine whether or not to accept the reflective photo-mask.

Alternatively or additionally, the reflective photo-mask may be qualified based on comparisons between the estimated resist pattern and actual patterned wafer patterns produced or generated using a reflective photo-mask. For example, a wafer-exposure system (such as a photolithographic exposure tool) may be used to produce a printed wafer using the reflective photo-mask, and a printed wafer image of the pattern on the printed wafer may be determined using a wafer-imaging system (such as the PUMA™ patterned wafer-inspection platform from KLA-Tencor, Inc., of San Jose, Calif.). However, this brute-force approach is often expensive and time consuming. In addition, errors introduced in the photolithographic process in the wafer-exposure system may reduce the accuracy of the qualification decision made by the computer system.

Thus, the calculation technique may overcome the limitations in existing reflective photo-mask inspection and qualification, for example, by providing a low-cost and efficient technique for determining whether or not a reflective photo-mask (including any defects) is acceptable. Therefore, the calculation technique may improve reflective photo-mask and/or wafer yield, and thus may decrease the cost and time to market of reflective photo-masks and integrated circuits.

In some embodiments of method 100 there may be additional or fewer operations. Moreover, the order of the operations may be changed, and/or two or more operations may be combined into a single operation. For example, in some embodiments ray tracing is used to account for the divergence or spreading of contributions to the reflected light that are associated with at least the defect. Furthermore, in some embodiments horizontal sampling (such as the size of the discrete cells in a horizontal plane) across the multilayer stack is varied based on a relative position with respect to at least the defect so that the horizontal sampling is increased in proximity to the defect and is decreased distal from the defect. Thus, coarse and fine horizontal sampling may be used in the calculation technique.

Figure 2A:
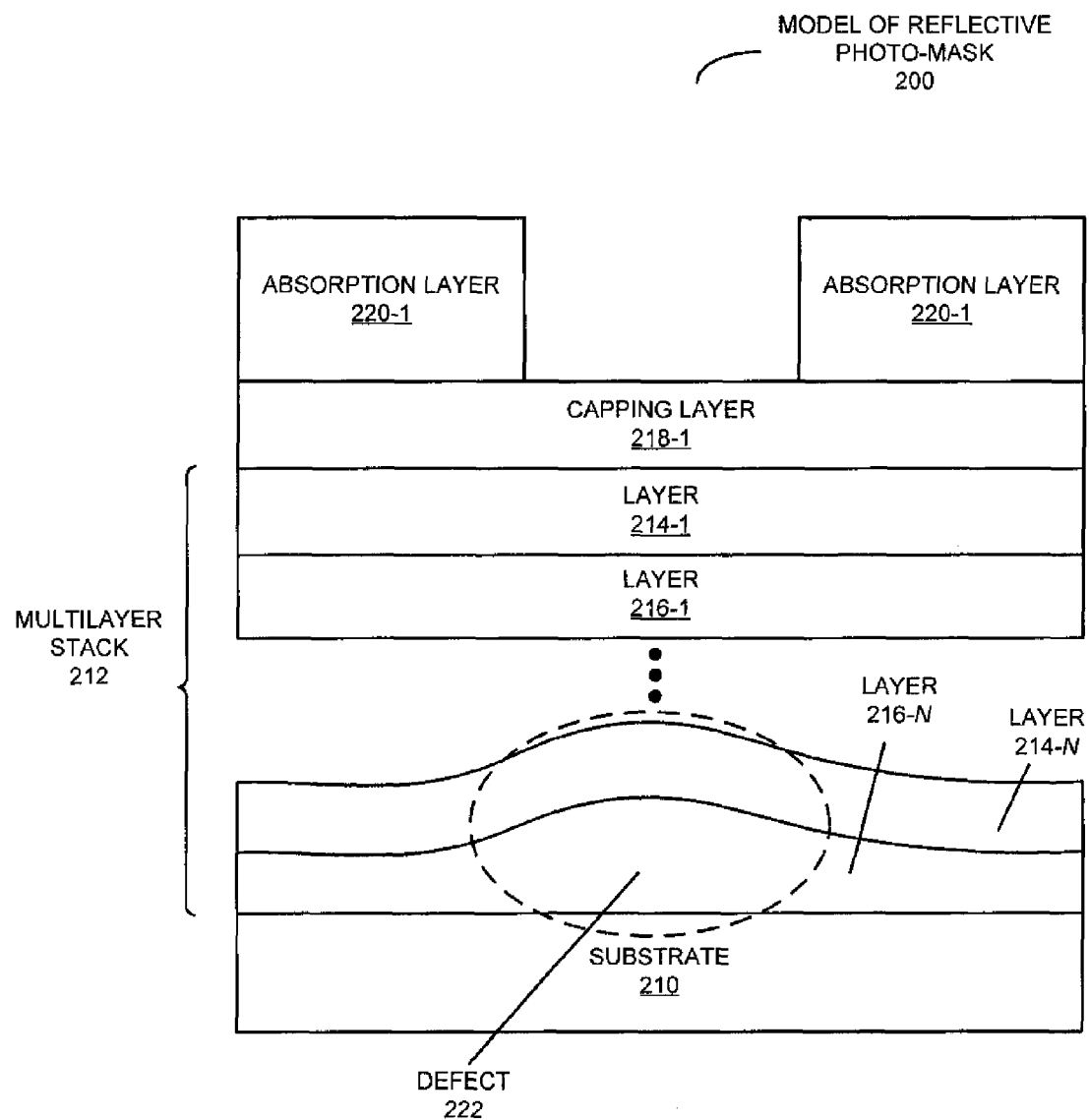
FIG. 2A is a block diagram illustrating a model of a reflective photo-mask in accordance with an embodiment of the present invention.

In an exemplary embodiment, the calculation technique is used to determine the reflected light from a model of a reflective photo-mask that includes at least one defect. This is shown in FIG. 2A, which presents a block diagram illustrating a model of a reflective photo-mask 200. In this model of reflective photo-mask 200, a multilayer stack 212 is deposited on a substrate 210 (such as silicon or quartz). Note that multilayer stack 212 includes alternating layers 214 and 216. For example, these layers may, respectively, include silicon and molybdenum, and may, respectively, have thicknesses of 4 nm and 2 nm. In some embodiments, there are 40 instances of alternating layers 214 and 216 (or 80 layers in total). Note that in the model, each of layers 214 and 216 may be subdivided into multiple discrete cells (not shown).

Furthermore, a capping layer 218 (such as ruthenium) may be deposited onto multilayer stack 212. Additionally, an absorption layer 220-1 (such as tantalum nitride) may be deposited on top of capping layer 218, and this absorption layer 220-1 may be patterned (for example, using electron-beam lithography) to define the two-dimensional mask pattern.

The model of reflective photo-mask 200 may include a defect 222, such as one associated with a fabrication process. For example, the model of reflective photo-mask 200 may correspond to a reflective photo-mask that is fabricated using a sputtering process, and a buried defect, such as a 'bump' or change in vertical position, may occur between substrate 210 and multilayer stack 212 and/or between layers in multilayer stack 212. In some embodiments, defect 222 has a height of 15 nm, which results in a 1.5 nm vertical deviation or displacement at a surface of multilayer stack 212.

Note that defect 222, whose impact on the aerial image and/or the estimated photo-resist pattern is to be studied using the calculation technique, may be identified in a reflective photo-mask (for example, using micro-analysis) or it may be known that a manufacturing process used to fabricate the reflective photo-mask may be vulnerable to a type of defect, such as defect 222.

In some embodiments, the reflected light associated with the model of reflective photo-mask 200, the aerial image, and/or the estimated photo-resist pattern are calculated for a set of mask patterns. In this way, one or more mask patterns that are compatible with or that can be used safely with a particular mask pattern in a reflective photo-mask corresponding to the model of reflective photo-mask 200, e.g., mask patterns that result in acceptable aerial images and/or estimated photo-resist patterns, can be identified. Alternative, such calculations can be used to identify which reflective photo-masks may require remedial action (such as repair or rework) if a defect, such as defect 222, occurs.

In an exemplary embodiment, after calculating absorption of incident light (such as a plane wave) by absorption layer 220-1, the Fourier transform of a near-field diffraction pattern associated with the two-dimensional mask pattern is used to calculate the contributions to the reflected light. In particular, the reflection by each discrete cell in multilayer stack 212 may be calculated using a closed-form expression that assumes each discrete cell is an infinite two-dimensional sheet (which is sometimes referred to as a 'parallel segments' model). However, other models, such as a finite difference time domain model, may be used. Then, the calculated contributions are summed to generate the Fourier transform of a near-field diffraction pattern reflected from multilayer stack 212. Next, absorption of this reflected light by absorption layer 220-1 is calculated, and the resulting reflect light from the model of reflecting photo-mask 200 is used in a lithographic simulator to determine one or more aerial images and/or estimated photo-resist patterns.

Figure 2B:
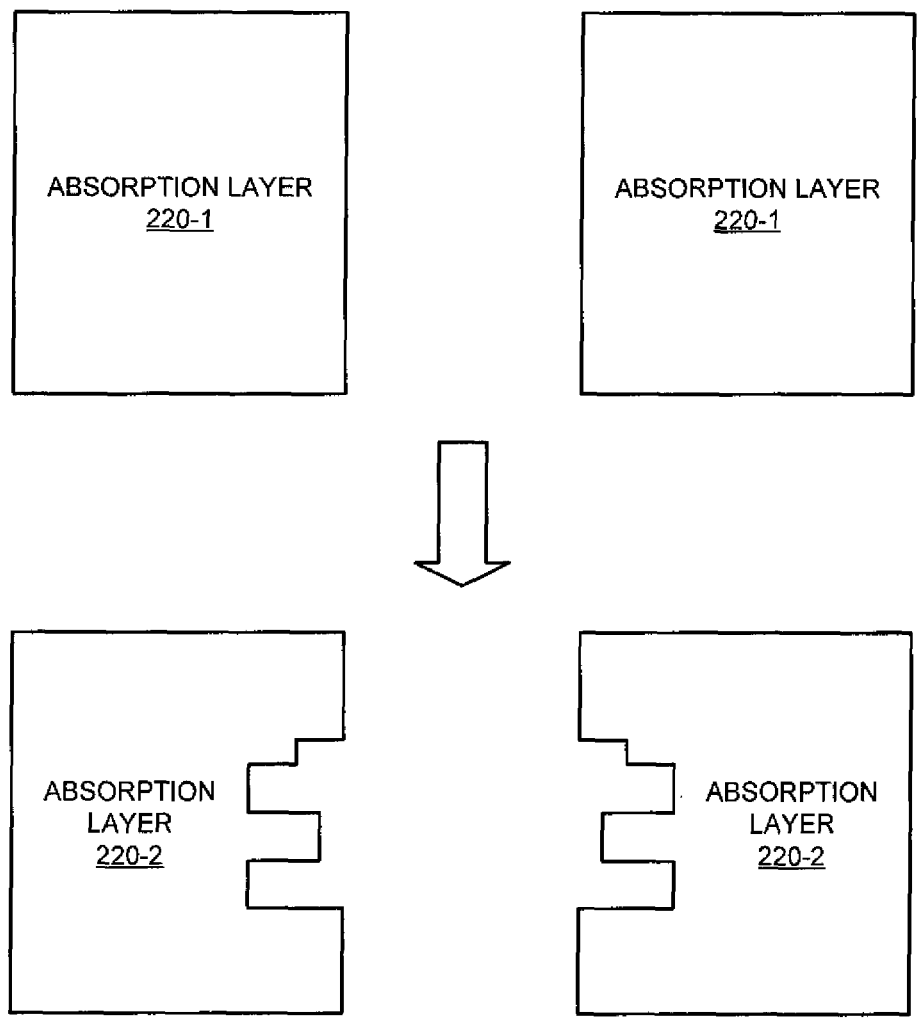
FIG. 2B is a block diagram illustrating a top view of multilayer defect compensation of an absorption layer in a reflective photo-mask in accordance with an embodiment of the present invention.

As noted previously, in some embodiments a modification to the multilayer stack is calculated based on the defect, such as a change in a thickness of absorption layer 220-1 and/or may modify a two-dimensional pattern of absorption layer 220-1. This is shown in FIG. 2B, which presents a block diagram illustrating a top view of multilayer defect compensation of an absorption layer in a reflective photo-mask. In particular, using a forward optical calculation (such as that described in FIG. 3) and/or an inverse optical calculation (in which a desired output, such as a target pattern on a wafer is used to determine the modification to the absorption layer based on an intervening optical path in a photolithographic process), one or more edges of absorption layer 220-1 may be displaced to generate absorption layer 220-2. Alternatively or additionally, the thickness of absorption layer 220-1 may be changed in at least a region of the reflective photo-mask. In general, the modifications to absorption layer 220-2 may correct for or reduce the impact of a defect (such as defect 222 in FIG. 2A) on a resulting wafer pattern (such as the impact on a critical dimension or a threshold of a line) that is fabricated in a photolithographic process.

In an exemplary embodiment, absorption layer 220-1 has 88 nm dense lines (on the reflective photo-mask) and the light has a 6° angle of incidence. Furthermore, defect 222 (FIG. 2A) may be 3 nm tall and may have a 65 nm full-width at half maximum. As shown in FIG. 2A, defect 222 may be a defect on substrate 210, which results in vertical displacements of subsequent layers up to a surface of the reflective photo-mask. These vertical displacements may be centered 22 nm (on the reflective photo-mask) from an edge of absorption layer 220-1. Furthermore, the vertical displacements may be uniform from substrate 210 (FIG. 2A) to the surface of the reflective photo-mask. Note that this reflective photo-mask may be used in a photolithographic process characterized by a numerical aperture of 0.32 and a source pattern with a sigma of 0.75.

Figure 3:
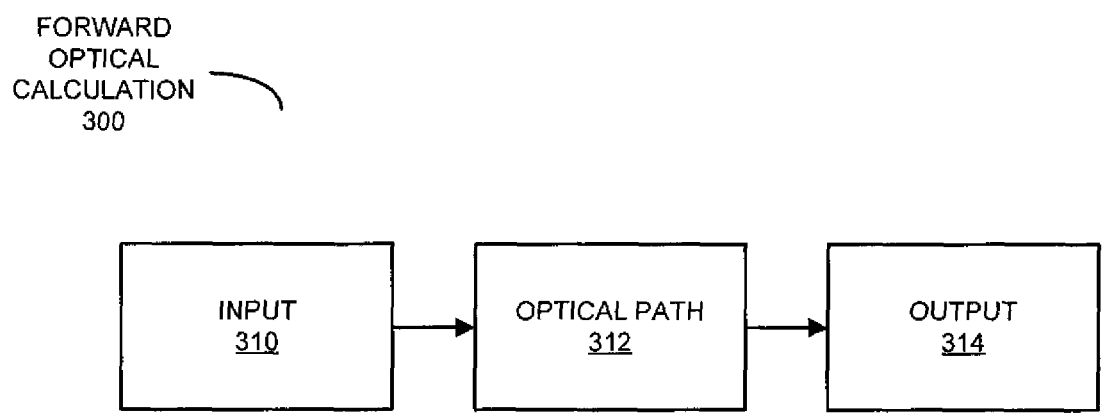
FIG. 3 is a block diagram illustrating a forward optical calculation in accordance with an embodiment of the present invention.

FIG. 3 presents a block diagram illustrating a forward optical calculation 300. In this calculation, the reflected light (such as the reflected light provided by a reflective photo-mask when illuminated by a source pattern) is used as an input 310 at an object plane of optical path 312 to determine a predicted output 314 (such as a pattern or an image) at an image plane of optical path 312. For example, using the calculated reflected light from the reflective photo-mask (which is illuminated by a source pattern) and information about the optical path in an exposure tool, the aerial image can be determined. In general, information about optical path 312 may include some or all of the aspects of the photolithographic process, such as: illumination settings, the electromagnetics of the photo-mask, the exposure-tool optics, etc. In addition, in some embodiments forward optical calculation 300 models the effect of a photoresist, including flare and/or etch effects.

Note that calculations corresponding to one or more optical paths in forward optical calculation 300 may be implemented using Fourier-optical techniques. Furthermore, the optical path in forward optical calculation 300 may include multiple models of optical paths (such as in a multiple-exposure photolithographic process). Also note that while optical path 312 has been traversed in a particular direction, this optical path may be traversed in either direction.

Furthermore, note that forward optical calculation 300 may take into account, by way of example but not limitation, various illumination conditions (e.g., off-axis, incoherent), the actual electromagnetics of the light field interacting with the reflective photo-mask, aberrations in optical path 312, and/or the vector nature of the electromagnetic field as it propagates through optical path 312. In some embodiments, aspects of forward optical calculation 300 (such as the mask pattern) are represented using one or more level-set functions. Furthermore, in some embodiments, forward optical calculation 300 is divided into a series of overlapping sub-problems (also referred to as 'work units'), at least some of which are processed independently and/or concurrently. These work units may be based on elements or structures (for example, repetitive structures) in the mask pattern and/or the target pattern.

Figure 4:
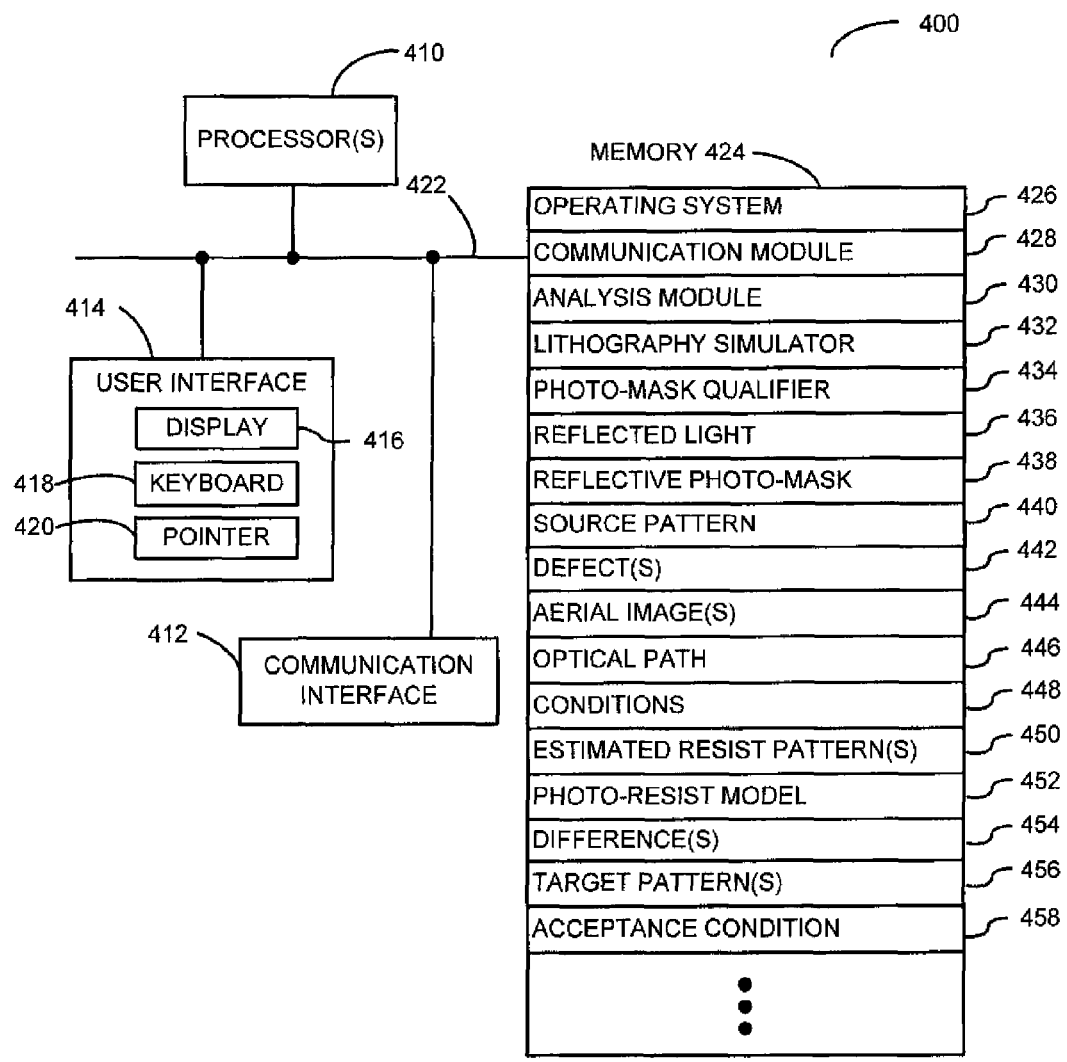
FIG. 4 is a block diagram illustrating a computer system in accordance with an embodiment of the present invention.

We now discuss computer systems for implementing the calculation technique. FIG. 4 presents a block diagram illustrating a computer system 400. Computer system 400 includes one or more processors 410, a communication interface 412, a user interface 414, and one or more signal lines 422 coupling these components together. Note that the one or more processing units 410 may support parallel processing and/or multi-threaded operation, the communication interface 412 may have a persistent communication connection, and the one or more signal lines 422 may constitute a communication bus. Moreover, the user interface 414 may include a display 416, a keyboard 418, and/or a pointer 420, such as a mouse.

Memory 424 in the computer system 400 may include volatile memory and/or non-volatile memory. More specifically, memory 424 may include ROM, RAM, EPROM, EEPROM, flash, one or more smart cards, one or more magnetic disc storage devices, and/or one or more optical storage devices. Memory 424 may store an operating system 426 that includes procedures (or a set of instructions) for handling various basic system services for performing hardware dependent tasks. The memory 424 may also store procedures (or a set of instructions) in a communication module 428. The communication procedures may be used for communicating with one or more computers and/or servers, including computers and/or servers that are remotely located with respect to the computer system 400.

Memory 424 may also include multiple program modules (or a set of instructions), including: analysis module 430 (or a set of instructions), lithography simulator 432 (or a set of instructions), and/or photo-mask qualifier 434 (or a set of instructions). Note that one or more of these program modules (or sets of instructions) may constitute a computer-program mechanism. Furthermore, note that one or more of these program modules (or sets of instructions) may be implemented as a stand-alone software application, or as a program module or subroutine in another application, such as photo-mask inspection software.

During operation of computer system 400, analysis module 430 may determine reflected light 436 from a model of a reflective photo-mask 438 based on a source pattern 440 that illuminates reflective photo-mask 438. This model of the reflective photo-mask may include one or more defects 442.

Next, lithography simulator 432 may calculate one or more aerial image(s) 444 in a forward optical calculation using reflected light 436 and information about an optical path 446. This calculation may also use photolithographic conditions 448. Furthermore, lithography simulator 432 may calculate estimated resist pattern(s) 450 using one or more aerial image(s) 444 and a photoresist model 452.

After these calculations are performed, photo-mask qualifier 434 may identify a difference(s) 454 (or features) between aerial image(s) 444 and/or estimated resist pattern(s) 450 and target pattern(s) 456 (such as portions of a circuit), and may determine an acceptance condition 458 of the reflective photo-mask based on the identified difference(s) 454.

Instructions in the various modules in memory 424 may be implemented in a high-level procedural language, an object-oriented programming language, and/or in an assembly or machine language. The programming language may be compiled or interpreted, i.e, configurable or configured to be executed, by the one or more processing units 410.

In some embodiments, at least some of the information in memory 424 is encrypted. For example, the lithographic simulator 432 and/or its output files (such as estimated resist pattern(s) 450) may be encrypted. Furthermore, information 'stored' in memory 424 in FIG. 4 may be stored locally and/or at remote locations.

Although the computer system 400 is illustrated as having a number of discrete items, FIG. 4 is intended to be a functional description of the various features that may be present in the computer system 400 rather than as a structural schematic of the embodiments described herein. In practice, and as recognized by those of ordinary skill in the art, the functions of the computer system 400 may be distributed over a large number of servers or computers, with various groups of the servers or computers performing particular subsets of the functions. In some embodiments, some or all of the functionality of the computer system 400 may be implemented in one or more ASICs, one or more field programmable gate arrays (FPGAs), and/or one or more digital signal processors (DSPs). In some embodiments the functionality of the computer system 400 may be implemented more in hardware and less in software, or less in hardware and more in software, as is known in the art.

In the preceding discussion, a 'computer system' may include a variety of devices, such as: a personal computer, a laptop computer, a mainframe computer, a portable electronic device, a server and/or a client computer (in a client-server architecture), and/or other device capable of manipulating computer-readable data or communicating such data between two or more computing systems over a network (such as the Internet, an Intranet, a LAN, a WAN, a MAN, or combination of networks, or other technology enabling communication between computing systems).

In some embodiments, reflective photo-mask 200 (FIG. 2A), forward optical calculation 300 (FIG. 3), and/or computer system 400 include fewer or additional components. Furthermore, in these embodiments two or more components may be combined into a single component and/or a position of one or more components may be changed.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for calculating reflected light from a multilayer stack in a reflective photo-mask, comprising:

determining, using a computer, contributions from multiple discrete cells in a model of the multilayer stack in the reflective photo-mask to the reflected light based on angles of incidence of light in a light pattern to the multilayer stack, a polarization of the light in the light pattern, and a varying intensity of the light in the light pattern through the multilayer stack, wherein the multiple discrete cells are at horizontal and vertical positions in the multilayer stack, and wherein the multilayer stack includes at least one defect;

adjusting phase values of the contributions to the reflected light from the multiple discrete cells, thereby specifying optical path differences between the multiple discrete cells in the multilayer stack that are associated with the defect;

combining the contributions to the reflected light from multiple discrete cells to determine the reflected light from the multilayer stack; and selectively shifting k-space representations of the contributions to the reflected light from the multiple discrete cells based on the angles of incidence, thereby accounting for phase variations associated with deviations from normal incidence.

2. The method of claim 1, wherein the horizontal and vertical positions are included in horizontal planes in the multilayer stack that are separated by a spacing.

3. The method of claim 1, wherein determining the reflected light from a given discrete cell in the multiple discrete cells uses a closed-form expression for the reflected light.

4. The method of claim 3, wherein the closed-form expression treats the given discrete cell as an infinite two-dimensional sheet in the multilayer stack.

5. The method of claim 1, wherein the defect is associated with vertical displacements or a change in a thickness of one or more layers in a region in the multilayer stack.

6. The method of claim 1, wherein, for a given discrete cell, the varying intensity of the light pattern through the multilayer stack involves calculating cumulative reflection and absorption by intervening discrete cells between the given discrete cell and a top surface of the multilayer stack.

7. The method of claim 1, wherein, prior to determining the contributions to the reflected light from the multiple discrete cells, the method further comprises calculating absorption of incident light to the reflective photo-mask by an absorption layer in the model, which is deposited on the multilayer stack in the reflective photo-mask, thereby determining the light pattern incident to the multilayer stack, wherein the absorption layer includes a mask pattern of the reflective photo-mask.

8. The method of claim 7, wherein the incident light is represented by a plane wave.

9. The method of claim 7, wherein the light pattern includes a near-field diffraction pattern associated with the mask pattern.

10. The method of claim 7, wherein, after combining the contributions to the reflected light from multiple discrete cells, the method further comprises calculating absorption of the reflected light from the reflective photo-mask by the absorption layer, thereby calculating reflected light from the reflective photo-mask.

11. The method of claim 10, wherein the method further comprises calculating an aerial image at an image plane of an optical path in a photolithographic process using a forward optical calculation based on the reflected light from the reflective photo-mask, information about the optical path in the photolithographic process and conditions associated with the photolithographic process.

12. The method of claim 11, wherein the method further comprises calculating an estimated resist pattern based on the aerial image and a model of a photoresist in the photolithographic process.

13. The method of claim 12, wherein the method further comprises:

identifying differences between the estimated resist pattern and a target pattern; and determining an acceptance condition of the reflective photo-mask based on the identified differences.

14. The method of claim 7, wherein the method further comprises calculating a modification to the absorption layer based on the defect.

15. A non-transitory computer-program product for use in conjunction with a computer system, the computer-program product comprising a computer-readable storage medium and a computer-program mechanism embedded therein to calculate reflected light from a multilayer stack in a reflective photo-mask, the computer-program mechanism including:
   instructions for determining contributions from multiple discrete cells in a model of the multilayer stack in the reflective photo-mask to the reflected light based on angles of incidence of light in a light pattern to the multilayer stack, a polarization of the light in the light pattern, and a varying intensity of the light in the light pattern through the multilayer stack, wherein the multiple discrete cells are at horizontal and vertical positions in the multilayer stack, and wherein the multilayer stack includes at least one defect;
   instructions for adjusting phase values of the contributions to the reflected light from the multiple discrete cells, thereby specifying optical path differences between the multiple discrete cells in the multilayer stack that are associated with the defect;
   instructions for combining the contributions to the reflected light from multiple discrete cells to determine the reflected light from the multilayer stack; and
   instructions for selectively shifting k-space representations of the contributions to the reflected light from the multiple discrete cells based on the angles of incidence, thereby accounting for phase variations associated with deviations from normal incidence.

16. The computer-program product of claim 15, wherein the defect is associated with vertical displacements or a change in a thickness of one or more layers in a region in the multilayer stack.

17. The computer-program product of claim 15, wherein, prior to the instructions for determining the contributions to the reflected light from the multiple discrete cells, the computer-program mechanism further includes instructions for calculating absorption of incident light to the reflective photo-mask by an absorption layer in the model, which is deposited on the multilayer stack in the reflective photo-mask, thereby determining the light pattern incident to the multilayer stack, wherein the absorption layer includes a mask pattern of the reflective photo-mask.

18. The computer-program product of claim 17, wherein, after the instructions for combining the contributions to the reflected light from multiple discrete cells, the computer-program mechanism further includes instructions for calculating absorption of the reflected light from the reflective photo-mask by the absorption layer, thereby calculating reflected light from the reflective photo-mask.

19. The computer-program product of claim 18, wherein the computer-program mechanism further includes instructions for calculating an aerial image at an image plane of an optical path in a photolithographic process using a forward optical calculation based on the reflected light from the reflective photo-mask, information about the optical path in the photolithographic process and conditions associated with the photolithographic process.

20. The computer-program product of claim 19, wherein the computer-program mechanism further includes instructions for calculating an estimated resist pattern based on the aerial image and a model of a photoresist in the photolithographic process.

21. The computer-program product of claim 19, wherein the computer-program mechanism further includes instructions for calculating a modification to the absorption layer based on the defect.

22. A computer system, comprising:
   at least one processor;
   at least one memory; and
   at least one program module, the program module stored in the memory and configured to be executed by the processor to calculate reflected light from a multilayer stack in a reflective photo-mask, the program module including:
      instructions for determining contributions from multiple discrete cells in a model of the multilayer stack in the reflective photo-mask to the reflected light based on angles of incidence of light in a light pattern to the multilayer stack, a polarization of the light in the light pattern, and a varying intensity of the light in the light pattern through the multilayer stack, wherein the multiple discrete cells are at horizontal and vertical positions in the multilayer stack, and wherein the multilayer stack includes at least one defect;
      instructions for adjusting phase values of the contributions to the reflected light from the multiple discrete cells, thereby specifying optical path differences between the multiple discrete cells in the multilayer stack that are associated with the defect;
      instructions for combining the contributions to the reflected light from multiple discrete cells to determine the reflected light from the multilayer stack; and
      instructions for selectively shifting k-space representations of the contributions to the reflected light from the multiple discrete cells based on the angles of incidence, thereby accounting for phase variations associated with deviations from normal incidence.

* * * * *